United States Patent
Kang et al.

(10) Patent No.: US 9,026,716 B2
(45) Date of Patent: May 5, 2015

(54) SYSTEM AND METHOD FOR MANAGING GARBAGE COLLECTION IN SOLID-STATE MEMORY

(75) Inventors: Ho-Fan Kang, Aliso Viejo, CA (US); Alan Chingtao Kan, Diamond Bar, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 702 days.

(21) Appl. No.: 12/778,740

(22) Filed: May 12, 2010

(65) Prior Publication Data

US 2011/0283049 A1 Nov. 17, 2011

(51) Int. Cl.
*G06F 12/00* (2006.01)
*G06F 12/02* (2006.01)
*G11C 16/16* (2006.01)

(52) U.S. Cl.
CPC ............ *G06F 12/0246* (2013.01); *G11C 16/16* (2013.01); *G06F 2212/7205* (2013.01)

(58) Field of Classification Search
USPC ......................................................... 711/103
See application file for complete search history.

(56) References Cited

U.S. PATENT DOCUMENTS

| | | | |
|---|---|---|---|
| 5,093,780 A | 3/1992 | Sunahara | |
| 5,123,094 A | 6/1992 | MacDougall | |
| 5,634,099 A | 5/1997 | Andrews et al. | |
| 6,088,740 A | 7/2000 | Ghaffari et al. | |
| 6,205,521 B1 * | 3/2001 | Schumann | 711/144 |
| 6,338,122 B1 | 1/2002 | Baumgartner et al. | |
| 6,475,062 B1 | 11/2002 | Kubota et al. | |
| 6,678,801 B1 | 1/2004 | Greim et al. | |
| 6,757,781 B2 | 6/2004 | Williams et al. | |
| 6,760,820 B2 | 7/2004 | Henson et al. | |
| 6,856,556 B1 | 2/2005 | Hajeck | |
| 6,862,151 B2 | 3/2005 | Hoskins et al. | |

(Continued)

FOREIGN PATENT DOCUMENTS

| | | |
|---|---|---|
| CN | 101404028 A | 4/2009 |
| CN | 101419573 A | 4/2009 |

OTHER PUBLICATIONS

Hu et al., "Write Amplification Analysis in Flash-Based Solid State Drives", SYSTOR'09, Haifa, 2009, Zurich Research Laboratory,copyright 2009 IBM Corporation, downloaded on May 12, 2010 from https://www.research.ibm.com/haifa/conferences/systor2009/papers/2_2_2.pdf, 13 pages.

Taratorin, Alexander M. and Klaas B. Klassen, Observation of Recording Pole Instability in Perpendicular Recording, IEEE Transactiion on Magnetics, vol. 42, No. Oct. 10, 2006, pp. 2267-2269.

(Continued)

*Primary Examiner* — Kaushikkumar Patel (57) ABSTRACT

Methods and systems for optimizing the selection of memory blocks for garbage collection to maximize the amount of memory freed by garbage collection operations are disclosed. Some of these systems and methods provide for the efficient selection of optimal or near-optimal garbage collection candidate blocks, with the most optimal selection defined as block(s) with the most invalid pages. In some cases, a controller classifies memory blocks into various invalid block pools by the amount of invalid pages each block contains. When garbage collection is performed, the controller selects a block from a non-empty pool of blocks with the highest minimum amount of invalid pages. The pools facilitate the optimal or near-optimal selection of garbage collection candidate blocks in an efficient manner and the data structure of the pools can be implemented with bitmasks, which take minimal space in memory.

31 Claims, 4 Drawing Sheets

(56) References Cited

U.S. PATENT DOCUMENTS

| | | |
|---|---|---|
| 6,969,989 B1 | 11/2005 | Mei |
| 7,082,494 B1 | 7/2006 | Thelin et al. |
| 7,114,041 B2 | 9/2006 | Hammitt et al. |
| 7,126,857 B2 | 10/2006 | Hajeck |
| 7,174,467 B1 | 2/2007 | Helms et al. |
| 7,310,699 B2 | 12/2007 | Sinclair |
| 7,313,641 B2 | 12/2007 | Koch et al. |
| 7,315,917 B2 | 1/2008 | Bennett et al. |
| 7,340,580 B2 | 3/2008 | Kinoshita |
| 7,363,396 B2 | 4/2008 | Liu et al. |
| 7,363,421 B2 | 4/2008 | Di Sena et al. |
| 7,366,826 B2 | 4/2008 | Gorobets et al. |
| 7,406,547 B2 | 7/2008 | Haines et al. |
| 7,424,587 B2 | 9/2008 | Caulkins et al. |
| 7,430,136 B2 | 9/2008 | Merry, Jr. et al. |
| 7,441,054 B2 | 10/2008 | Wu et al. |
| 7,441,067 B2 | 10/2008 | Gorobets et al. |
| 7,447,807 B1 | 11/2008 | Merry et al. |
| 7,457,903 B2 | 11/2008 | Purdham et al. |
| 7,487,286 B2 | 2/2009 | Nagano et al. |
| 7,502,256 B2 | 3/2009 | Merry, Jr. et al. |
| 7,509,441 B1 | 3/2009 | Merry et al. |
| 7,582,868 B2 | 9/2009 | Jiang et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,831,783 B2 * | 11/2010 | Pandit et al. .................. 711/159 |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2001/0034809 A1 * | 10/2001 | Ogawa .......................... 711/103 |
| 2002/0040413 A1 | 4/2002 | Okada et al. |
| 2002/0083111 A1 | 6/2002 | Row et al. |
| 2004/0193743 A1 | 9/2004 | Byers et al. |
| 2005/0193081 A1 | 9/2005 | Gruber et al. |
| 2005/0204187 A1 * | 9/2005 | Lee et al. ........................ 714/8 |
| 2006/0155917 A1 | 7/2006 | Di Sena et al. |
| 2006/0161724 A1 | 7/2006 | Bennett et al. |
| 2007/0016721 A1 | 1/2007 | Gay |
| 2007/0033332 A1 * | 2/2007 | Sinclair et al. ................ 711/103 |
| 2007/0043900 A1 | 2/2007 | Yun |
| 2007/0186032 A1 | 8/2007 | Sinclair et al. |
| 2007/0186065 A1 * | 8/2007 | Lee et al. ...................... 711/159 |
| 2008/0082736 A1 * | 4/2008 | Chow et al. ................... 711/103 |
| 2008/0091872 A1 | 4/2008 | Bennett et al. |
| 2008/0126685 A1 | 5/2008 | Danilak |
| 2008/0126719 A1 | 5/2008 | Danilak |
| 2008/0126720 A1 | 5/2008 | Danilak |
| 2008/0126891 A1 | 5/2008 | Danilak |
| 2008/0155166 A1 | 6/2008 | James et al. |
| 2008/0235306 A1 | 9/2008 | Kim et al. |
| 2008/0235443 A1 | 9/2008 | Chow et al. |
| 2008/0263305 A1 | 10/2008 | Shu et al. |
| 2008/0282024 A1 * | 11/2008 | Biswas et al. ................. 711/103 |
| 2008/0288717 A1 | 11/2008 | Torabi |
| 2008/0307164 A1 | 12/2008 | Sinclair |
| 2009/0012976 A1 | 1/2009 | Kang et al. |
| 2009/0017220 A1 | 1/2009 | Muller et al. |
| 2009/0070502 A1 | 3/2009 | Noha et al. |
| 2009/0116475 A1 | 5/2009 | Krzyzanowski et al. |
| 2009/0119460 A1 | 5/2009 | Lin et al. |
| 2009/0129163 A1 | 5/2009 | Danilak |
| 2009/0150599 A1 | 6/2009 | Bennett |
| 2009/0154026 A1 | 6/2009 | Jiang et al. |
| 2009/0172250 A1 | 7/2009 | Allen et al. |
| 2009/0172258 A1 | 7/2009 | Olbrich et al. |
| 2009/0172260 A1 | 7/2009 | Olbrich et al. |
| 2009/0271562 A1 * | 10/2009 | Sinclair ......................... 711/103 |
| 2009/0313501 A1 * | 12/2009 | Hallivuori ...................... 714/15 |
| 2009/0327589 A1 | 12/2009 | Moshayedi |
| 2010/0023672 A1 | 1/2010 | Garobets et al. |
| 2010/0037009 A1 * | 2/2010 | Yano et al. .................... 711/103 |
| 2010/0174849 A1 | 7/2010 | Walston et al. |
| 2010/0185806 A1 * | 7/2010 | Pruthi et al. ................... 711/103 |
| 2010/0250793 A1 | 9/2010 | Syu |
| 2010/0262760 A1 | 10/2010 | Swing et al. |
| 2011/0022778 A1 * | 1/2011 | Schibilla et al. ............... 711/103 |
| 2011/0055455 A1 | 3/2011 | Post et al. |
| 2011/0055458 A1 | 3/2011 | Kuehne |
| 2011/0099323 A1 | 4/2011 | Syu |
| 2011/0191566 A1 * | 8/2011 | Takamiya et al. .............. 711/206 |
| 2011/0231624 A1 * | 9/2011 | Fukutomi et al. .............. 711/162 |
| 2011/0283049 A1 | 11/2011 | Kang et al. |
| 2012/0239851 A1 * | 9/2012 | Calvert et al. ................. 711/103 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0024595 A1 | 1/2013 | Subramaniyan et al. |

(56) References Cited

U.S. PATENT DOCUMENTS

| | | |
|---|---|---|
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

OTHER PUBLICATIONS

Office Action under U.S. Appl. No. 12/771,771 dated May 22, 2012.

Office Action under U.S. Appl. No. 12/771,771 dated Oct. 24, 2012.

Webpage for Anandtech, located at www.anandtech.com, accessed on Jun. 17, 2011.

Notice of Allowance dated Apr. 2, 2013 issued in U.S. Appl. No. 12/777,771, 8 pages.

Ho-Fan Kang, U.S. Appl. No. 14/303,508, filed Jun. 12, 2014, 16 pages.

Chinese Office Action dated Jan. 30, 2015 from related Chinese Application Serial No. 201110126948.8, 8 pages.

\* cited by examiner

SYSTEM AND METHOD FOR MANAGING GARBAGE COLLECTION IN SOLID-STATE MEMORY

BACKGROUND

Solid-state storage subsystems execute many commands in the course of their normal operation. For example, garbage collection is frequently performed on memory blocks that may contain both valid and invalid data. When such a memory block is selected for garbage collection, the garbage collection operation copies valid data within the memory block to a new location in memory and then erases the entire memory block, making the entire block available for future data writes. Therefore, the amount of memory freed by the garbage collection process depends on the amount of invalid pages within the memory blocks selected for garbage collection.

BRIEF DESCRIPTION OF THE DRAWINGS

Systems and methods which embody the various features of the invention will now be described with reference to the following drawings, in which.

DETAILED DESCRIPTION

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

Overview

Embodiments of the invention are directed to optimizing the selection of memory blocks for garbage collection to maximize the amount of memory freed by garbage collection operations. The systems and methods disclosed herein provide for the efficient selection of optimal or near-optimal garbage collection candidate blocks, with the most optimal selection defined as block(s) with the most invalid pages. In one embodiment, a controller classifies memory blocks into various invalid block pools by the amount of invalid pages each block contains. When garbage collection is performed, the controller selects a block from a non-empty pool of blocks with the highest minimum amount of invalid pages. The pools facilitate the optimal or near-optimal selection of garbage collection candidate blocks in an efficient manner and the data structure of the pools can be implemented with bitmasks, which take minimal space in memory. Although the present disclosure describes various embodiments as applicable to blocks, the embodiments are not so limited and are applicable to other units of memory such as superblocks.

System Overview

Figure 1:
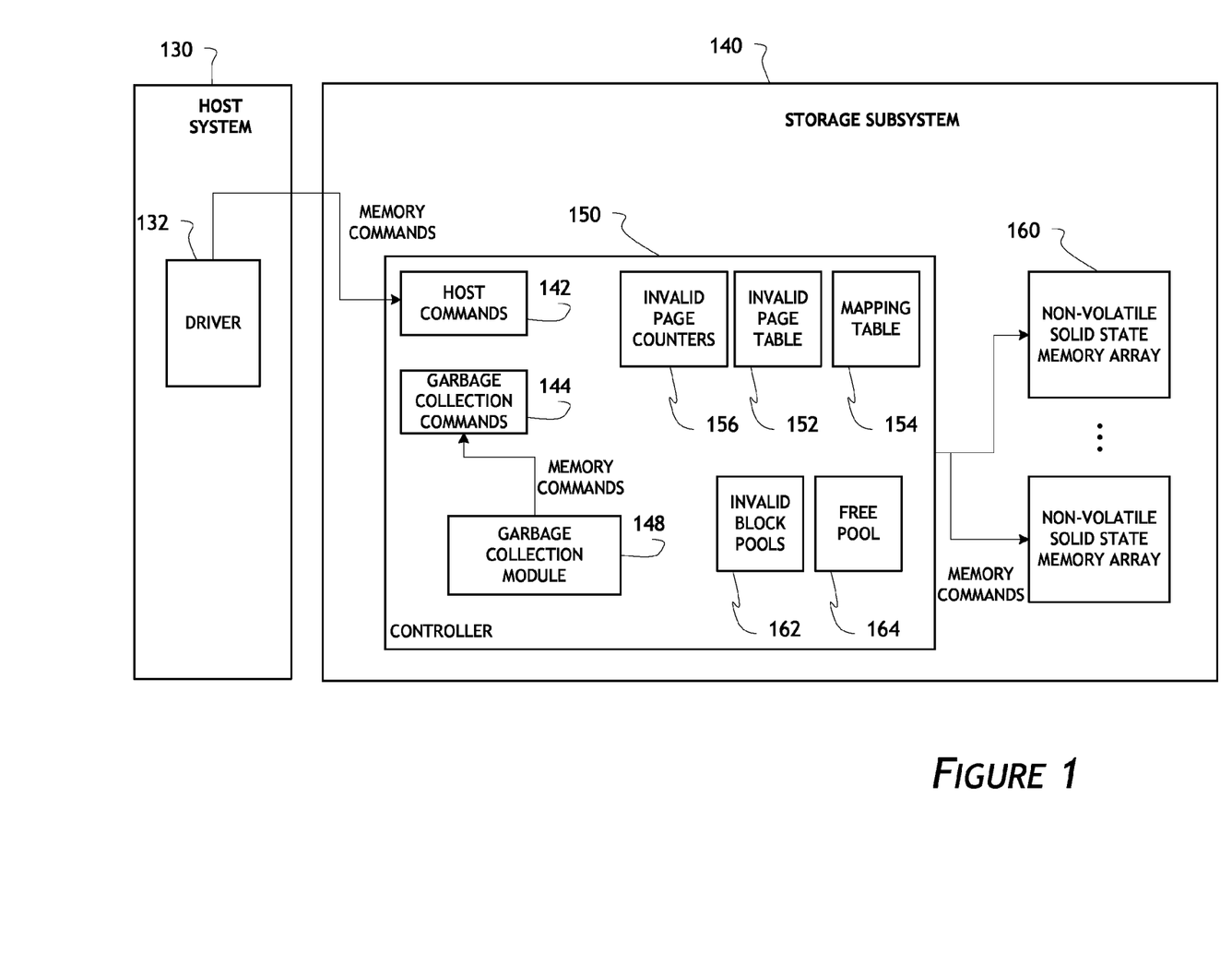
FIG. 1 is a block diagram illustrating a solid-state storage subsystem according to one embodiment.

FIG. 1 is a block diagram illustrating a storage subsystem embodiment. As shown, a storage subsystem 140 includes a controller 150, which in turn includes a host command queue 142, a garbage collection command queue 144, and a garbage collection module 148. In one embodiment, the host command queue 142 receives memory commands from a driver 132 residing within a host system 130 and the garbage collection command queue 144 receives commands from the garbage collection module 148, which manages garbage collection. In other embodiments, the commands from the driver 132 and the garbage collection module 148 are received into a single queue for execution. The memory commands from the driver 132 may include write and read commands issued by the host system 130, while memory commands from the garbage collection module 148 may include commands used for garbage collection. As further shown in FIG. 1, in one embodiment, the controller 150 executes the commands in the host command queue 142 and the garbage collection command queue 144 in one or more non-volatile solid-state memory arrays 160.

The controller 150 also maintains several data structures including, in one embodiment, an invalid page table 152 and a mapping table 154. In one embodiment, the invalid page table 152 keeps track of the validity of data located at physical page addresses throughout the non-volatile solid-state memory arrays 160, while the mapping table 154 keeps track of the correspondence between logical block addresses (LBA) and physical page addresses in the non-volatile solid-state memory arrays 160. In one embodiment, other data structures include invalid page counters 156, invalid block pools 162, and a free pool 164. In one embodiment, invalid page counters 156 are maintained for at least some of the memory blocks in the memory arrays 160. In one embodiment, an invalid page counter 156 is maintained for each block and tracks the number of invalid pages within the associated block. In one embodiment, the invalid page counters 156 and/or the invalid page table 152 are stored in dynamic random access memory (DRAM). The blocks are assigned in one embodiment to various invalid block pools 162. For example, blocks that are in use may be classified into a pool for blocks with at least 25% invalid pages, a pool for blocks with at least 50% invalid pages, a pool for blocks with at least 75% invalid pages, or a pool for blocks with 100% invalid pages. Blocks that are available for new writes are classified into the free pool 164. In one embodiment, the data structures related to the pool assignments are stored in static random access memory (SRAM). The use and maintenance of these data structures for garbage collection will be further described below.

Maintaining Invalid Page Data of Memory Blocks

Figure 2:
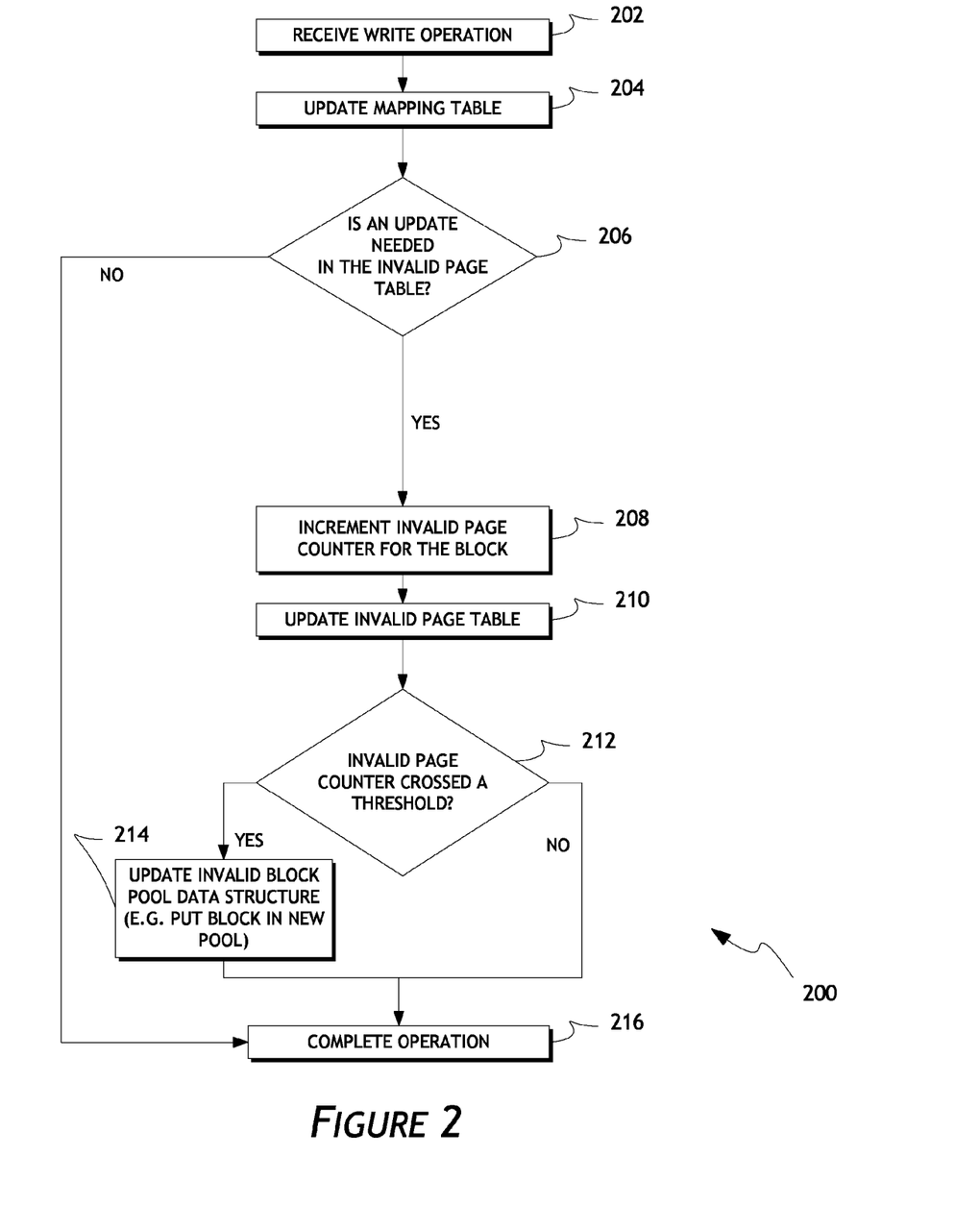
FIG. 2 is a flow diagram illustrating a method for maintaining invalid page information on memory blocks within a solid-state storage subsystem according to one embodiment.

FIG. 2 is a flow diagram illustrating a method 200 for maintaining invalid page information on memory blocks according to one embodiment. In block 202, the controller 150 begins by receiving a write command (operation) for execution. The write operation may be issued by the host system 130. In block 204, the controller updates the mapping table 154 as part of executing the write operation. In one embodiment, the controller updates the mapping table by first locating, in the mapping table, an entry for the LBA in the write command to determine a physical page address that corresponds to the LBA, and then by updating the located entry with the new physical page address at which the new data is written. For example, a write may be directed to LBA 10, which prior to the write operation was mapped to block 5, page 2. Before the actual write to memory, the controller updates the mapping table so that the entry for LBA 10 corresponds to the new location at which the data will be written (e.g. block 12, page 4). Alternatively, the controller may update the mapping table after the actual write to memory. In block 206, the controller determines whether an update to the invalid page table is needed. In most instances this is needed unless the particular LBA entry associated with the write operation has not been previously assigned to any physical address. In the above example, since block 5, page 2 is now invalid, the portion of the invalid page table 154 covering block 5 needs to be updated. If an update is needed, the method proceeds to block 208, where the controller increments the invalid page counter 156 for the block with the change. The invalid page table 152 is then updated in block 210.

The controller performs another check in block 212 to determine if the page counter for the block with the change has crossed an invalid page threshold. If a threshold has been crossed, the block is re-assigned to a new pool in block 214. Following the example above, if an invalid page counter indicates that the number of invalid pages within block 5 has increased to 1024 out of 2048 total, then block 5 is re-assigned from the 25% invalid pool to the 50% invalid pool. In one embodiment, the controller process that handles write operations from the host obtains a lock on the invalid page counter, invalid page table, and the invalid block pool data structure or a subset of those data structures while performing the above referenced update tasks. Since the garbage collection process consults with some of the same data structures in its operation, locking these data structures prevents the garbage collection process and other internal system processes from reading outdated data and executing commands that would cause data consistency problems. For example, as the invalid page table is used in one embodiment to block pending garbage collection commands from being executed on physical page addresses indicated as containing invalid information, locking the table while the updating takes place ensures that garbage collection commands attempting to write invalid data are properly blocked from execution in accordance with updated information. In other embodiments the various update steps may be executed in a different order than that shown in FIG. 2.

Using Invalid Page Data to Select Memory Blocks for Garbage Collection

Figure 3:
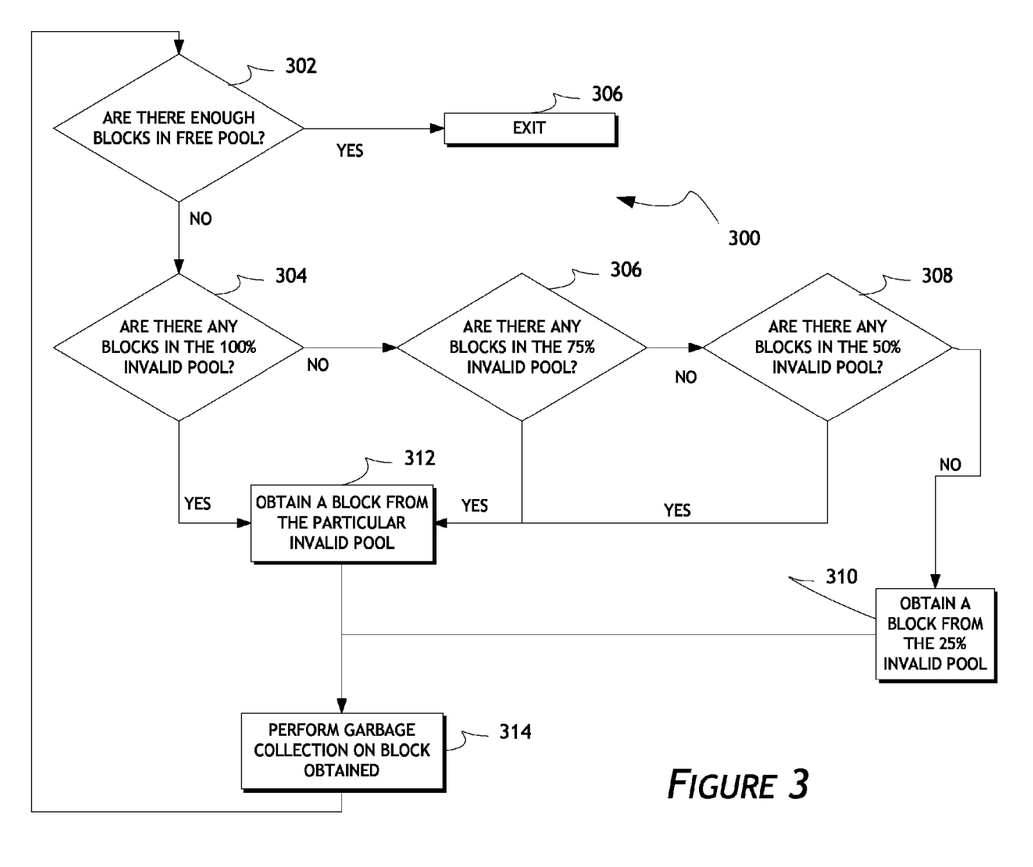
FIG. 3 is a flow diagram illustrating a method for selecting memory blocks for garbage collection in accordance with one embodiment.

FIG. 3 is a flow diagram illustrating a method for selecting memory blocks for garbage collection in accordance with one embodiment. In one embodiment, the method 300 is performed by the controller 150 to select an optimal or near-optimal candidate block for garbage collection. As discussed above, an optimal selection involves selecting a block with the highest number of invalid pages to maximize the amount of memory freed by a garbage collection operation.

In FIG. 3, the threshold percentages associated with the individual pools are provided as examples only and other percentages may be used. In addition, in one embodiment the lowest threshold percentage is set in accordance with the amount of over-provisioning (additional storage over stated capacity) provided in the non-volatile memory arrays. For example, the lowest threshold percentage may be equal to or greater than the over-provisioning amount, since the over-provisioning amount correlates to the minimum amount of invalid pages in the blocks when free blocks are exhausted. In the illustrated example, the lowest threshold of 25% invalid pages corresponds to the 25% over-provisioning provided in the example storage subsystem. In other embodiments, the number of pools may be set to other numbers and the lowest threshold percentage may be higher or lower than the over-provisioning percentage. In one embodiment, the threshold of at least one pool is set at 100% or near 100% invalid to capture blocks that would yield the most amount of space after garbage collection.

The method 300 begins in block 302, where the controller determines whether there are enough blocks remaining in the free pool to accommodate pending write operations. Garbage collection is triggered if it is determined that there are not enough blocks in the free pool, and the method moves to block 304, where the controller determines if there are any blocks in the 100% invalid pool. If so, a memory block from that pool is selected in block 312. If not, the controller determines if there are any blocks in the 75% invalid pool in block 306. If so, a memory block from that pool is selected in block 312. The same process is repeated for the 50% invalid pool in block 308 if none are found in the 75% pool. Finally, if there are no blocks in the 100%, 75%, or 50% pool, a block is chosen from the 25% pool in block 310. The 25% pool is the default pool in this example and is expected to contain at least one block because block 310 is reached only if the free pool is determined to be exhausted in block 302. This is because an over-provisioning of 25% guarantees at least one block with at least 25% invalid pages when there are no more free blocks. The selected candidate block in block 310 or 312 is then used in the garbage collection operation in block 314. Finally, while the selection of a single block is shown in FIG. 3, other embodiments may select multiple blocks together from one or more pools for garbage collection. For example, if the controller determines that 45 blocks are needed for garbage collection and only 10 are in the 100% pool and 41 are in the 75% pool, the controller may select 10 from the 100% pool and the remaining 35 it needs from the 75% pool.

Multi-Pool Data Structure

Figure 4:
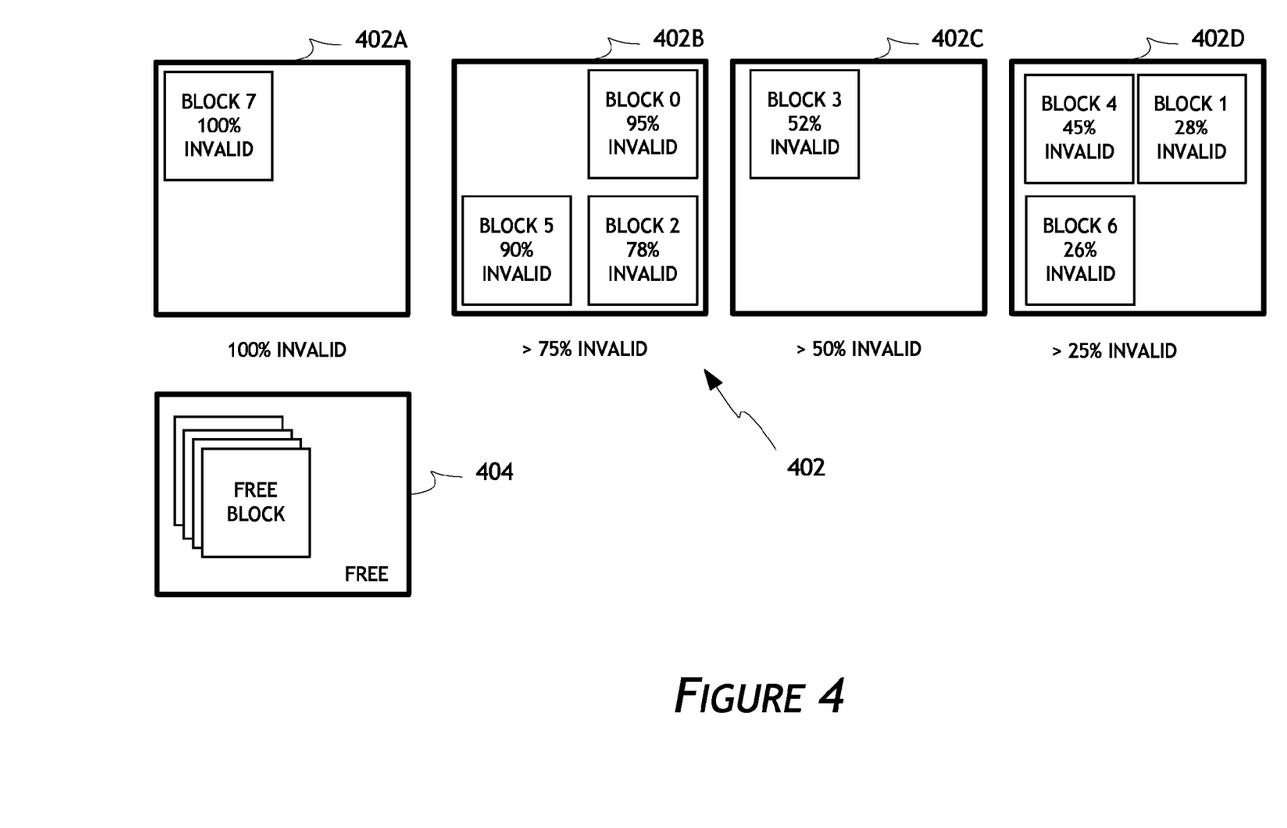
FIG. 4 illustrates an example of using invalid block and free block pools to track memory blocks for garbage collection according to one embodiment.

FIG. 4 illustrates an example set of invalid block pools 402 according to one embodiment. As shown, example blocks 0-7 are distributed in the four pools 402A-D in accordance with the number of invalid pages each block contains. As previously shown in FIG. 3, the controller triggers garbage collection if it determines that there are not enough blocks in the free pool 404. If and when this occurs, block 7 would be selected first for garbage collection since it belongs to the 100% invalid pool. If more blocks are still needed for garbage collection, in the next iteration the controller would select any block from pool 402B (block 0, block 2, or block 5), since pool 402A is now empty and pool 402B is now the non-empty pool with the highest minimum invalid page threshold (at least 75%).

In one embodiment, to achieve speed optimization, the selection of a block assigned to a pool with multiple blocks does not depend on the blocks' actual percentages of invalid pages and a candidate block within the pool may be selected based on the current location of a selection process or a block may be randomly selected. The selection process may traverse the blocks in a consecutive fashion to locate a next available block assigned to the highest non-empty pool. For example, if the selection process last ended a search for a candidate block at block 1, block 2 would be selected since there are no more blocks in the 100% pool (block 7 has been taken) and block 2 is the first block in the 75% pool encountered in the selection process. Thus block 2 may be selected from pool 402B even though it has a lower percentage than block 0 or block 5. In the next iteration block 5 would be selected as the selection process picks up from block 3, moves to block 4, and finds block 5, which is the next block that belongs to the 75% pool. In other embodiments, additional checks and/or comparisons may be performed so a block with a higher or the highest percentage within the same pool may be selected. In various embodiments, several blocks are selected at once and may span across different pools (e.g. blocks 7 may be selected along with blocks 0, 2, and 5). However, in some embodiments, the selection progression remains from the pool of blocks with the highest minimum amount of invalid pages to the pool of blocks with the lowest minimum amount of invalid pages.

While the selection process removes blocks from the pools, other memory operations may cause blocks to be re-assigned to a pool with a higher minimum amount of invalid pages or blocks to be newly assigned to a pool if the blocks previously did not meet any of the thresholds.

In one embodiment, the pool structure is implemented with bitmasks, and a block may be associated with one or more bits that indicate its assignment to the pools. For example, a four-pool structure may involve four corresponding bitmasks for the blocks, with each bitmask indicating whether the individual blocks belong to a particular pool. In one embodiment, additional checking bits may be assigned to a group of blocks to speed up the selection process. For example, a checking bit may be used to indicate the status of 32 blocks, such that when the checking bit is set to "0" the selection process can skip over the 32 blocks knowing that none of the blocks have a "1" bit indicating an assignment to the particular pool in question. If the checking bit is set to "1," the selection process will check the individual bits for the 32 blocks since the "1" indicates that at least one block is assigned to the particular pool. In another embodiment, additional checking bits may be assigned to groups of checking bits in a hierarchal order. For example, an additional checking bit may be assigned to a group of checking bits so that if any of the checking bits is set to "1," the additional bit will be set to "1" as well. The checking bit approach reduces the time needed to locate a block assigned to the pool with the highest minimum amount of invalid pages. In another embodiment, the pool assignments are maintained in a table.

The multi-pool data structure provides an efficient method for selecting optimal or near optimal candidate blocks for garbage collection. In one embodiment, a sorted linked list structure is used to organize the blocks that are eligible for garbage collection. In one embodiment, the blocks are sorted in the linked list by the amount of invalid pages in the blocks, so that the optimal candidate for garbage collection can be located by selecting a block from the front or back of the linked list (depending on the direction of the sort). In one embodiment, the above described pools are implemented in a sorted linked list structure with pointers to entries that correspond to the minimum invalid page thresholds of the individual pools, so that blocks assigned to the individual pools can be quickly located. In another embodiment, one or more linked lists are used for each pool, and blocks are assigned to a pool as described above and inserted into the one or more linked lists for the corresponding pool. In some embodiments, the pool data structure implemented with bitmasks may need substantially less overhead memory as compared to the linked list implementations. This difference can be substantial in storage subsystems in which there are potentially millions of blocks or tens of thousands of superblocks that may be candidates for garbage collection at any given time.

CONCLUSION

The features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A storage subsystem, comprising:
a non-volatile solid-state memory array; and
a controller comprising a garbage collection module and configured to receive and execute memory commands from a host system and the garbage collection module, the controller further configured to:
maintain, for a first memory block in the memory array, an invalid page counter for storing data related to a number of invalid pages within the first memory block, the first memory block assigned by the number of invalid pages into a first pool, wherein the garbage collection module is configured to select memory blocks from a plurality of pools based on the number of invalid pages, wherein the first memory block is associated with a first group of memory blocks, the first group of memory blocks including a plurality of checking bits, each checking bit from the plurality of checking bits corresponding to a different pool from the plurality of pools, the checking bits configured to indicate whether at least one memory block of the first group of memory blocks is assigned to the corresponding pool;
upon executing a memory command from the host system that causes a change in a validity of a page within the first memory block,
update an invalid page counter associated with the first memory block; and
reassign the first memory block to a second pool when the updated invalid page counter exceeds a threshold and set a checking bit corresponding to the second pool to indicate that at least one memory block of the first group of memory blocks is assigned to the second pool.

2. The storage subsystem of claim 1, wherein the controller is further configured to assign the first memory block to a pool for free memory blocks after the first memory block undergoes garbage collection.

3. The storage subsystem of claim 1, wherein each of the plurality of pools is assigned with blocks having a different minimum number of invalid pages and the garbage collection module is configured to select, for garbage collection, a second memory block assigned to a third pool with a highest minimum number of invalid pages.

4. The storage subsystem of claim 3, wherein the plurality of pools comprise the first pool initially configured for memory blocks with at least 25% invalid pages, the second pool initially configured for memory blocks with at least 50% invalid pages, the third pool initially configured for memory blocks with at least 75% invalid pages, and a fourth pool initially configured for memory blocks with 100% invalid pages.

5. The storage subsystem of claim 1, wherein a data structure is used to store data related to pool assignments of the memory blocks.

6. The storage subsystem of claim 5, wherein the data structure is stored in static random access memory (SRAM).

7. The storage subsystem of claim 5, wherein the data structure is a tree structure.

8. The storage subsystem of claim 5, wherein the controller is further configured to obtain a lock on the data structure prior to reassigning the first memory block into a different pool.

9. The storage subsystem of claim 1, wherein the controller is further configured to obtain a lock on the invalid page counter prior to updating the page counter.

10. The storage subsystem of claim 1, wherein the invalid page counter is stored in dynamic random access memory (DRAM).

11. The storage subsystem of claim 1, wherein the plurality of checking bits comprises a checking bit for each pool of the plurality of pools.

12. A method of managing memory operations in non-volatile solid-state memory, the method comprising:
   maintaining, for a first memory block in the non-volatile solid-state memory, an invalid page counter for storing data related to a number of invalid pages within the first memory block, the first memory block classified by the number of invalid pages into a first pool of a plurality of pools, wherein the first memory block is associated with a first group of memory blocks, the first group of memory blocks including a plurality of checking bits, each checking bit from the plurality of checking bits corresponding to a different pool from the plurality of pools, the checking bits configured to indicate whether at least one memory block of the first group of memory blocks is assigned to the corresponding pool;
   upon receipt of a write command from a host system that causes a change in a validity of a page within the first memory block,
      updating an invalid page counter for the first memory block; and
      reclassifying the first memory block to a second pool when the invalid page counter of the first memory block indicates that a number of invalid pages within the first memory block exceeds a threshold and setting a checking bit corresponding to the second pool to indicate that at least one memory block of the first group of memory blocks is assigned to the second pool.

13. The method of claim 12, further comprising:
   selecting, for garbage collection, a second memory block classified in a third pool with a highest minimum threshold of invalid pages.

14. The method of claim 13, wherein the plurality of pools comprise the first pool initially configured for memory blocks with at least 25% invalid pages, the second pool initially configured for memory blocks with at least 50% invalid pages, the third pool initially configured for memory blocks with at least 75% invalid pages, and a fourth pool initially configured for memory blocks with 100% invalid pages.

15. The method of claim 12, further comprising:
   locating, in a mapping table, an entry for a logical address in the write command to determine a physical page address that corresponds to the logical address;
   updating an invalid page table with information that blocks pending garbage collection commands from being executed at the physical page address;
   executing the write command; and
   updating the located entry in the mapping table with a new physical address at which the data is written by the execution of the write command.

16. The method of claim 15, wherein the updating the invalid page table further comprises updating an entry in the invalid page table to indicate that data at the physical page address is invalid.

17. The method of claim 15, wherein the invalid page table is implemented as a bitmask wherein a bit is used to represent a validity of data at a page address.

18. The method of claim 15, wherein the invalid page table is stored in DRAM.

19. The method of claim 12, wherein a data structure is used to store data related to pool classifications of the memory blocks.

20. The method of claim 19, wherein the data structure is stored in SRAM.

21. The method of claim 19, wherein the data structure is a tree structure.

22. The method of claim 12, wherein the invalid page counter is stored in DRAM.

23. The method of claim 12, wherein the plurality of checking bits comprises a checking bit for each pool of the plurality of pools.

24. A method for selecting memory blocks in a non-volatile memory array of a storage subsystem for garbage collection memory commands, the method comprising:
   maintaining data related to a number of invalid pages within the memory blocks;
   assigning the memory blocks to a plurality of pools, each of the pools configured to have a different minimum threshold of invalid pages in the individual memory blocks assigned to the pool, wherein the memory blocks are associated with a plurality of checking bits, each checking bit from the plurality of checking bits corresponding to a different pool from the plurality of pools, the checking bits configured to indicate whether at least one memory block is assigned to the corresponding pool;
   identifying, from the plurality of pools, a pool with the highest minimum threshold for garbage collection that includes memory blocks assigned to the pool, said identifying based, at least in part, on the checking bits;
   selecting a memory block from the assigned memory blocks for garbage collection;
   updating the data when a memory command received from a host system causes a validity of a page within the memory block to be changed;
   reassigning the memory block containing the page to a new pool with a higher minimum threshold of invalid pages based on the updated data; and
   setting a checking bit corresponding to the new pool to indicate that at least one memory block from the memory blocks is assigned to the new pool.

25. The method of claim 24, wherein the plurality of checking bits comprises a checking bit for each pool of the plurality of pools.

26. A method for selecting memory blocks in a non-volatile memory array of a storage subsystem for garbage collection memory commands, the method comprising:
   maintaining statistical data regarding how many pages within the memory blocks are invalid;
   using the statistical data to maintain a plurality of pools of memory blocks based on the number of invalid pages, wherein the memory blocks are associated with a plurality of checking bits, each checking bit from the plurality of checking bits corresponding to a different pool from the plurality of pools, the checking bits configured to indicate whether at least one memory block is assigned to the corresponding pool;
   identifying from the plurality of pools a first pool that includes a first memory block from the memory blocks, said identifying based, at least in part, on the checking bits;

selecting the first memory block for garbage collection;
updating the statistical data when a memory command received from a host system causes a validity of a page within the first memory block to be changed;
reassigning the first memory block containing the page to a new pool with a different threshold of invalid pages than the first pool associated with the memory block based on the updated statistical data; and
setting a checking bit corresponding to the new pool to indicate that at least one memory block from the memory blocks is assigned to the new pool.

27. The method of claim 26, wherein the plurality of checking bits comprises a checking bit for each pool of the plurality of pools.

28. A storage subsystem, comprising:
a non-volatile solid-state memory array; and
a controller comprising a garbage collection module and configured to select memory blocks in the non-volatile memory array for garbage collection memory commands, the controller further configured to:
maintain statistical data regarding how many pages within the memory blocks are invalid;
assign the memory blocks to a plurality of pools, each of the pools configured to have a different minimum threshold of invalid pages in the individual memory blocks assigned to the pool, wherein the memory blocks are associated with a plurality of checking bits, each checking bit from the plurality of checking bits corresponding to a different pool from the plurality of pools, the checking bits configured to indicate whether at least one memory block is assigned to the corresponding pool;
identify, from the plurality of pools, a pool with the highest minimum threshold for garbage collection that includes memory blocks assigned to the pool, said identifying based, at least in part, on the checking bits; and
select a memory block from the assigned memory blocks for garbage collection; and
when a memory command received from a host system causes a validity of a page within the memory block to be changed, update the statistical data, reassign the memory block containing the page to a new pool with a higher minimum threshold of invalid pages based on the updated statistical data, and
set a checking bit corresponding to the new pool to indicate that at least one memory block from the memory blocks is assigned to the new pool.

29. The storage subsystem of claim 28, wherein the plurality of checking bits comprises a checking bit for each pool of the plurality of pools.

30. A storage subsystem, comprising:
a non-volatile solid-state memory array; and
a controller comprising a garbage collection module and configured to select memory blocks in the non-volatile memory array for garbage collection memory commands, the controller further configured to:
maintain statistical data regarding how many pages within the memory blocks are invalid;
use the statistical data to maintain a plurality of pools of memory blocks based on the number of invalid pages, wherein the memory blocks are associated with a plurality of checking bits, each checking bit from the plurality of checking bits corresponding to a different pool from the plurality of pools, the checking bits configured to indicate whether at least one memory block is assigned to the corresponding pool;
identify from the plurality of pools a first pool that includes a first memory block from the memory blocks, said identifying based, at least in part, on the checking bits;
select the first memory block for garbage collection; and
when a memory command received from a host system causes a validity of a page within the first memory block to be changed, update the statistical data, reassign the first memory block containing the page to a new pool with a different threshold of invalid pages than the first pool based on the updated statistical data, and
set a checking bit corresponding to the new pool to indicate that at least one memory block from the memory blocks is assigned to the new pool.

31. The storage subsystem of claim 30, wherein the plurality of checking bits comprises a checking bit for each pool of the plurality of pools.

* * * * *